(12) United States Patent
Katsuki et al.

(10) Patent No.: US 7,842,621 B2
(45) Date of Patent: Nov. 30, 2010

(54) METHOD OF MEASURING NITROGEN CONCENTRATION, METHOD OF FORMING SILICON OXYNITRIDE FILM, AND METHOD OF MANUFACTURING SEMICONDUCTOR DEVICE.

(75) Inventors: Jiro Katsuki, Nirasaki (JP); Tetsuro Takahashi, Nirasaki (JP); Shuuichi Ishizuka, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 211 days.

(21) Appl. No.: 12/300,877

(22) PCT Filed: May 17, 2007

(86) PCT No.: PCT/JP2007/060104
§ 371 (c)(1),
(2), (4) Date: Nov. 14, 2008

(87) PCT Pub. No.: WO2007/132913
PCT Pub. Date: Nov. 22, 2007

(65) Prior Publication Data
US 2009/0253221 A1   Oct. 8, 2009

(30) Foreign Application Priority Data
May 17, 2006   (JP)   ............................. 2006-137708

(51) Int. Cl.
*G01R 31/26*   (2006.01)
*H01L 21/66*   (2006.01)
*H01L 21/31*   (2006.01)

(52) U.S. Cl. .......................... 438/769; 438/14; 438/775; 438/786; 438/787; 257/E21.521; 257/E21.525; 257/E21.529; 257/E21.53

(58) Field of Classification Search .......... 257/E21.521, 257/E21.525, E21.529, E21.53
See application file for complete search history.

(56) References Cited

U.S. PATENT DOCUMENTS

| | | | | |
|---|---|---|---|---|
| 6,245,689 | B1 * | 6/2001 | Hao et al. | 438/769 |
| 6,281,146 | B1 * | 8/2001 | Wang et al. | 438/788 |
| 2004/0259380 | A1 * | 12/2004 | Fukuda et al. | 438/776 |
| 2007/0026149 | A1 * | 2/2007 | Shimizu et al. | 427/248.1 |

* cited by examiner

*Primary Examiner*—Charles D Garber
*Assistant Examiner*—Mohsen Ahmadi
(74) *Attorney, Agent, or Firm*—Oblon, Spivak, McClelland, Maier & Neustadt, L.L.P.

(57) ABSTRACT

The total film thickness T1N of silicon oxynitride film and silicon oxide film remaining as its underlying layer is measured. A measurement target substrate is re-oxidized, and, after the re-oxidization, the total film thickness (T2N) of the silicon oxynitride film, silicon oxide film and silicon oxide film resulting from the re-oxidization on the target substrate is measured. Separately, a reference substrate provided with silicon oxide film is re-oxidized, and, after the re-oxidization, the total film thickness T2 of the silicon oxide film and silicon oxide film resulting from the re-oxidization on the reference substrate is measured. Re-oxidization rate reduction ratio RORR of the measurement target substrate is calculated by the following formula (1) from the values of total film thicknesses T1N, T2N and T2. The nitrogen concentration of the silicon oxynitride film of the target substrate is determined from the calculated re-oxidization rate reduction ratio RORR. RORR (%)={(T2−T2N)/(T2−T1N)}×100 (1).

20 Claims, 8 Drawing Sheets

METHOD OF MEASURING NITROGEN CONCENTRATION, METHOD OF FORMING SILICON OXYNITRIDE FILM, AND METHOD OF MANUFACTURING SEMICONDUCTOR DEVICE.

FIELD OF THE INVENTION

The present invention relates to a method of measuring a nitrogen concentration in a silicon oxynitride film, a method of forming a silicon oxynitride film including measuring a nitrogen concentration using the above method, and a method of manufacturing a semiconductor device.

BACKGROUND OF THE INVENTION

In response to the recent trends of increasing the degree of integration and speed of LSI, the design rule of an LSI semiconductor device are being further reduced. Such reduced design rule is also applied to, e.g., planar type transistors. However, as the dimension of a planar type transistor becomes smaller, problems involving increased leakage current, higher power consumption and higher driving voltage arise. Therefore, it is thought that a limit exists in increasing the degree of integration beyond a 32-nanometer node. In this regard, transistors having a three-dimensional (3D) structure such as a fin structure, a recess gate structure and a double gate structure are recently being developed.

On the other hand, in the fabrication of such a conventional planar type transistor, a silicon oxide film ($SiO_2$ film) used as a gate insulating film is nitrided such that nitrogen is introduced into the film, thus forming a silicon oxynitride film (SiON film) (see, e.g., Japanese Patent Application Publication Nos. H9-148543 and H10-32328). It is known that, by forming the silicon oxynitride film when forming the silicon oxynitride film, the dielectric constant is increased to thereby reduce an equivalent oxide thickness (EOT) and leakage current.

Further, also in the above-mentioned 3D-structured transistors, EOT and leakage current are expected to decrease as in the conventional planar type transistor by using the silicon oxynitride film as the gate insulating film in place of the silicon oxide film. However, in case of the 3D-structured transistor, the gate insulating film also is formed in a three dimensional structure. Therefore, the concentration of nitrogen introduced by nitridation may differ between a sidewall portion and a planar portion in the gate insulating film. Since the nitrogen concentration in the gate insulating film affects the electrical properties of the device, it is necessary that the nitrogen concentration of each of the sidewall and the planar portion in the 3D-structured gate insulating film be accurately measured. Further, in nitriding process, the process conditions need to be determined such that each portion in the resulting silicon oxynitride film shows its desired level of nitrogen concentration.

For measuring the nitrogen concentration in the silicon oxynitride film, XPS (X-ray Photoelectron Spectroscopy) and SIMS (Secondary Ion Mass Spectrometry), for example, are being used. Although these methods are suitable for measuring a planar silicon oxynitride film, it is difficult to measure the nitrogen concentration only in the sidewall portion with a high accuracy by applying these methods to a silicon oxynitride film of a three dimensional shape in a 3D-structured device. This is because, when performing a measurement of the nitrogen concentration in the sidewall portion by the above methods, the sum of the nitrogen concentrations in the sidewall portion and in the planar portion is obtained as the measurement result instead of the nitrogen concentration only in the sidewall portion.

SUMMARY OF THE INVENTION

It is an object of the present invention to provide a method of measuring a nitrogen concentration capable of distinctly indicating the nitrogen concentration in different portions of a three-dimensional silicon oxynitride film.

Further, it is another object of the present invention to provide a method of forming a silicon oxynitride film which includes measuring the nitrogen concentration using the above method; and a method of manufacturing a semiconductor device.

In accordance with a first aspect of the present invention, there is provided a method of measuring a nitrogen concentration in a silicon oxynitride film obtained by nitriding a silicon oxide film formed on a surface of a measurement target substrate, comprising:

measuring a total film thickness $T_1N$ of the silicon oxynitride film and the silicon oxide film remaining thereunder;

reoxidizing the measurement target substrate;

measuring a total film thickness $T_2N$ of the silicon oxynitride film, the silicon oxide film and a reoxidized silicon oxide film formed on the measurement target substrate after reoxidizing the measurement target substrate;

reoxidizing a reference substrate having a silicon oxide film formed thereon independently of the measurement target substrate;

measuring a total film thickness $T_2$ of the silicon oxide film and a reoxidized silicon oxide film formed on the reference substrate after reoxidizing the reference substrate;

calculating a reoxidation rate reduction ratio of the measurement target substrate from the total film thicknesses $T_1N$, $T_2N$ and $T_2$ by using Equation 1; and determining the nitrogen concentration in the silicon oxynitride film on the measurement target substrate based on the calculated reoxidation rate reduction ratio, wherein Equation 1 is as follows:

$$RORR(\%) = \{(T_2 - T_2N)/(T_2 - T_1N)\} \times 100.$$

In accordance with a second aspect of the present invention, there is provided a method of forming a silicon oxynitride film by nitriding a silicon oxide film formed on a surface of a processing target substrate, comprising:

nitriding a silicon oxide film formed on a surface of a measurement target substrate to form a silicon oxynitride film;

measuring a total film thickness $T_1N$ of the silicon oxynitride film measurement target substrate and the silicon oxide film remaining thereunder;

reoxidizing the measurement target substrate;

measuring a total film thickness $T_2N$ of the silicon oxynitride film, the silicon oxide film and a reoxidized silicon oxide film formed on the measurement target substrate after reoxidizing the measurement target substrate;

reoxidizing a reference substrate having a silicon oxide film formed thereon independently of the measurement target substrate;

measuring a total film thickness $T_2$ of the silicon oxide film and a reoxidized silicon oxide film formed on the reference substrate after reoxidizing the reference substrate;

calculating a reoxidation rate reduction ratio of the measurement target substrate from the total film thicknesses $T_1N$, $T_2N$ and $T_2$ by using Equation 1;

determining the nitrogen concentration in the silicon oxynitride film on the measurement target substrate based on the calculated reoxidation rate reduction ratio;

determining nitriding process conditions for the silicon oxide film on the processing target substrate based on the determined nitrogen concentration; and nitriding the silicon oxide formed on the surface of the processing target substrate under the determined nitriding process conditions to form the silicon oxynitride film;

wherein Equation 1 is as follows:

$$RORR(\%)=\{(T_2-T_2N)/(T_2-T_1N)\}\times 100.$$

In accordance with a third aspect of the present invention, there is provided a method of manufacturing a semiconductor device including forming a silicon oxynitride film by nitriding a silicon oxide film formed on a surface of a processing target substrate, wherein said forming the silicon oxynitride film comprises:

nitriding a silicon oxide film formed on a surface of a measurement target substrate to form a silicon oxynitride film;

measuring a total film thickness $T_1N$ of the silicon oxynitride film measurement target substrate and the silicon oxide film remaining thereunder;

reoxidizing the measurement target substrate;

measuring a total film thickness $T_2N$ of the silicon oxynitride film, the silicon oxide film and a reoxidized silicon oxide film formed on the measurement target substrate after reoxidizing the measurement target substrate;

reoxidizing a reference substrate having a silicon oxide film formed thereon independently of the measurement target substrate;

measuring a total film thickness $T_2$ of the silicon oxide film and a reoxidized silicon oxide film formed on the reference substrate after reoxidizing the reference substrate;

calculating a reoxidation rate reduction ratio of the measurement target substrate from the total film thicknesses $T_1N$, $T_2N$ and $T_2$ by using Equation 1;

determining the nitrogen concentration in the silicon oxynitride film on the measurement target substrate based on the calculated reoxidation rate reduction ratio;

determining nitriding process conditions for the silicon oxide film on the processing target substrate based on the determined nitrogen concentration; and nitriding the silicon oxide formed on the surface of the processing target substrate under the determined nitriding process conditions to form the silicon oxynitride film, wherein Equation 1 is as follows:

$$RORR(\%)=\{(T_2-T_2N)/(T_2-T_1N)\}\times 100.$$

In the first to third aspects of the above, the silicon oxynitride film may be formed on a surface of a silicon layer in a three-dimensional structure with the silicon oxide film being disposed therebetween. In this case, the silicon layer may have a projection or a depression, and the silicon layer may be formed in a protruding shape on the measurement target substrate. Further, the reoxidizing may be conducted by thermal oxidation.

Further, in determining the nitrogen concentration in the silicon oxynitride film, a calibration curve may previously be prepared based on a nitrogen concentration in a silicon oxynitride film having a planar structure and the reoxidation rate reduction ratio, and the reoxidation rate reduction obtained by Equation 1 may be compared with the calibration curve.

Further, the silicon oxynitride film on the measurement target substrate may preferably be an insulating film in a three-dimensionally structured device. Further, the nitriding may preferably be conducted by a plasma processing apparatus that generates a plasma by introducing a microwave into a processing chamber using a planar antenna having slots.

In the third aspect of the above, the semiconductor device may be a three-dimensionally structured transistor.

In accordance with a fourth aspect of the present invention, there is provided a storage medium that stores a program running on a computer for controlling a plasma processing apparatus, wherein the program, when executed, has the computer control the plasma processing apparatus to perform a method of forming a silicon oxynitride film by nitriding a silicon oxide film formed on a surface of a processing target substrate, the method comprising:

nitriding a silicon oxide film formed on a surface of a measurement target substrate to form a silicon oxynitride film;

measuring a total film thickness $T_1N$ of the silicon oxynitride film measurement target substrate and the silicon oxide film remaining thereunder;

reoxidizing the measurement target substrate;

measuring a total film thickness $T_2N$ of the silicon oxynitride film, the silicon oxide film and a reoxidized silicon oxide film formed on the measurement target substrate after reoxidizing the measurement target substrate;

reoxidizing a reference substrate having a silicon oxide film formed thereon independently of the measurement target substrate;

measuring a total film thickness $T_2$ of the silicon oxide film and a reoxidized silicon oxide film formed on the reference substrate after reoxidizing the reference substrate;

calculating a reoxidation rate reduction ratio of the measurement target substrate from the total film thicknesses $T_1N$, $T_2N$ and $T_2$ by using Equation 1;

determining the nitrogen concentration in the silicon oxynitride film on the measurement target substrate based on the calculated reoxidation rate reduction ratio;

determining nitriding process conditions for the silicon oxide film on the processing target substrate based on the determined nitrogen concentration; and nitriding the silicon oxide formed on the surface of the processing target substrate under the determined nitriding process conditions to form the silicon oxynitride film, wherein Equation 1 is as follows:

$$RORR(\%)=\{(T_2-T_2N)/(T_2-T_1N)\}\times 100.$$

According to the present invention, a target substrate having a silicon oxynitride film formed thereon is subjected to a reoxidation process, and is compared with a reference substrate having a silicon oxynitride film also subjected to the reoxidation process under the same conditions. Thus, a reoxidation rate reduction ratio (RORR) is calculated, so that the nitrogen concentration can be obtained accurately and distinctly for each portion of the silicon oxynitride film formed on the surface of the target substrate. In a 3D-structured device, for example, the nitrogen concentration can be measured with a high precision separately for each of a planar portion and a sidewall portion of a 3-dimensional silicon oxynitride film.

Further, it is possible to optimize the nitriding process conditions by feeding back the nitrogen concentration in the silicon oxynitride film measured by the measuring method of the present invention, and adjusting the nitriding process conditions based thereon.

DETAILED DESCRIPTION OF THE PREFERRED EMBODIMENTS

Figure 1:
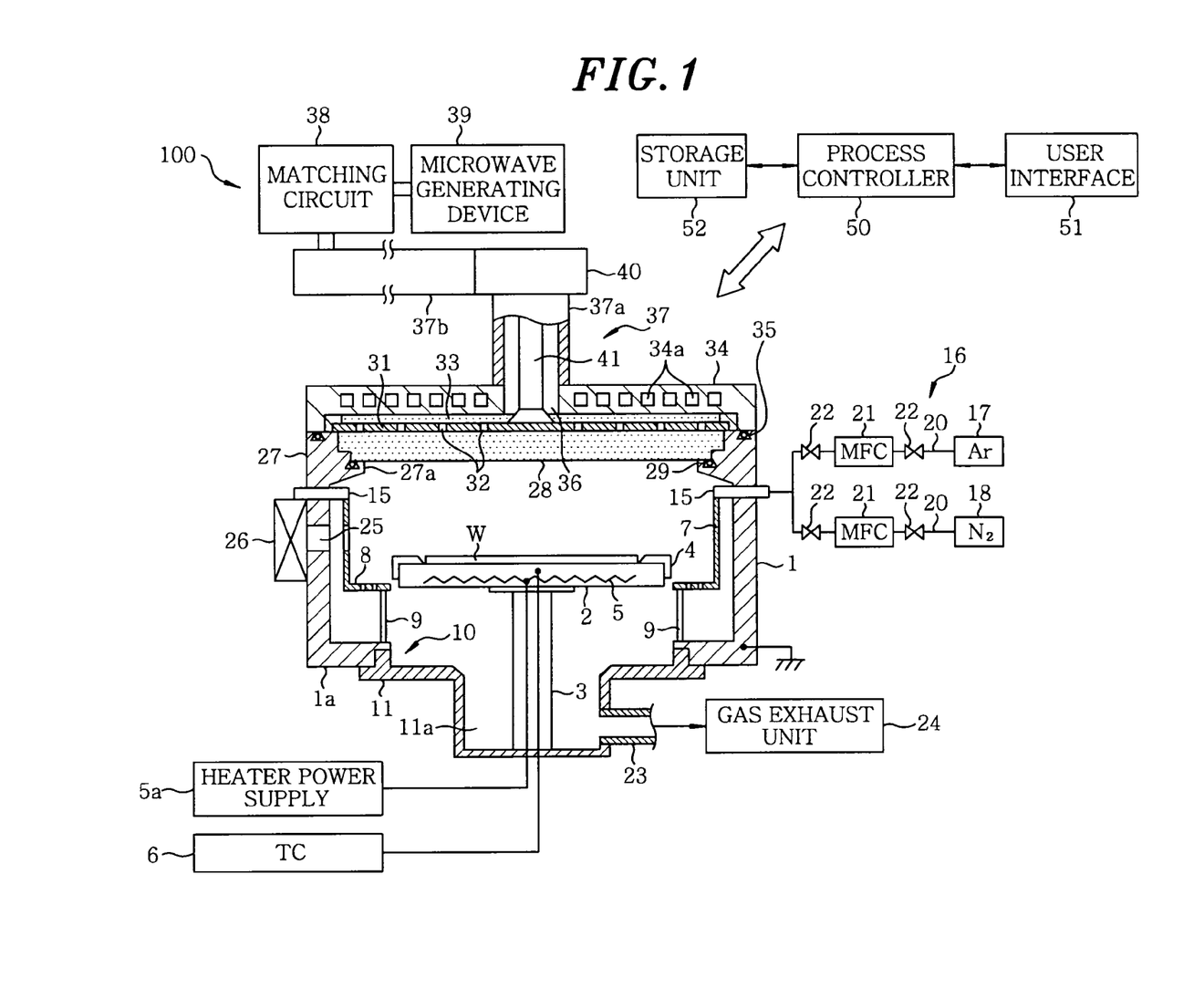
FIG. 1 schematically shows a plasma processing apparatus suitable for performing the method of the present invention.

Hereinafter, a detailed description of an embodiment of the invention will be given with reference to the accompanying drawings. FIG. 1 schematically shows the plasma processing apparatus usable for forming a silicon oxynitride film according to the method of the present invention. A plasma processing apparatus 100 is configured as an RLSA (Radial Line Slot Antenna) microwave plasma processing apparatus capable of generating a microwave-excited plasma of a high density and a low electron temperature by introducing a microwave into a processing chamber using a planar antenna having slots, especially an RLSA. The plasma processing apparatus 100 can perform a process using a plasma having a density of about $1 \times 10^{10}$ to $5 \times 10^{12}/cm^1$ and a low electron temperature of about 0.7 to 2 eV. Therefore, the plasma processing apparatus can be used for performing a nitriding process or the like in manufacturing various semiconductor devices.

The plasma processing apparatus 100 includes a substantially cylindrical airtight chamber 1 that is grounded. The chamber 1 may be of a square column shape. A circular opening 10 is formed at a substantially central portion of a bottom wall 1a in the chamber 1. A gas exhaust chamber 11 extends downward from the bottom wall 1a and communicates with the opening 10. The gas exhaust chamber 11 is connected to a gas exhaust unit 24 via a gas exhaust line 23.

Provided inside the chamber 1 is a mounting table 2 made of highly thermally conductive ceramic such as AlN for horizontally supporting a substrate, for example, a silicon wafer (hereinafter, simply referred to as "wafer") W. The mounting table 2 is supported by a cylindrical supporting member 3 extending upward from a center of a bottom portion of the gas exhaust chamber 11, the supporting member 3 being made of a ceramic such as AlN. Further, the a cover ring 4 is disposed at the mounting table 2 for covering an outer peripheral portion of the mounting table 2 and guiding the wafer W. The cover ring 4 is a member made of quartz, AlN, $Al_2O_3$, SiN and/or the like.

A resistive heater 5 is buried in the mounting table 2, which heats the mounting table 2 by using electric power supplied from a heater power supply 5a, such that the wafer W serving as a processing target substrate is uniformly heated. Further, the mounting table 2 is provided with a thermocouple 6 for controlling a heating temperature of the wafer W between a room temperature and about 900° C., for example. Wafer supporting pins (not shown) for supporting and vertically moving the wafer W are provided at the mounting table 2 so that they can be projected from and retracted into a surface of the mounting table 2.

Provided along an inner peripheral portion of the chamber 1 is a cylindrical quartz liner for preventing metal contamination from materials constituting the chamber. Further, an annular baffle plate 8 having a plurality of through holes for uniformly evacuating the inside of the chamber 1 is disposed along an outer peripheral portion of the mounting table 2. The baffle plate 8 is supported by support columns 9.

An annular gas inlet unit 15 is provided at a sidewall of the chamber 1, and a gas supply system 16 is connected with the gas inlet unit 15. The gas inlet unit may be configured in a nozzle or a showerhead shape. The gas supply system 16 has, for example, an Ar gas supply source 17 and a $N_2$ gas supply source 18. An Ar gas and a $N_2$ gas reach the gas inlet unit 15 via respective gas lines 20 and then are introduced via the gas inlet unit 15 into the chamber 1. Each of the gas lines 20 has a mass flow controller 21 and opening/closing valves 22 provided in upstream and downstream sides of the mass flow controller 21. Moreover, it is also possible to use a rare gas such as Kr gas, Xe gas, He gas or the like, instead of Ar gas.

The gas exhaust line 23 is connected to a side surface of the gas exhaust chamber 11, and the gas exhaust unit 24 having a high speed vacuum pump is connected to the gas exhaust line 23. By operating the gas exhaust unit 24, the gas inside the chamber 1 is uniformly discharged into a space 11a of the gas exhaust chamber 11 via the baffle plate 8, and then discharged to the outside via the gas exhaust line 23. As a result, the inside of the chamber 1 can be rapidly depressurized to a specific vacuum level of, for example, 0.133 Pa.

Formed on the sidewall of the chamber 1 are a transfer port 25 for loading and unloading the wafer W into/from a transfer chamber (not shown) disposed adjacent to the plasma processing apparatus 100 and a gate valve 26 for opening and closing the transfer port 25.

An upper portion of the chamber 1 is formed as an opening, and an annular upper plate 27 is coupled to the opening. A lower inner peripheral portion of the upper plate 27 protrudes towards an inner space of the chamber, thereby forming an annular support 27a. Further, a microwave transmitting plate 28 for transmitting a microwave is airtightly provided on the support 27a via a sealing member 29, the microwave transmitting plate 28 being made of a dielectric material, for example, quartz and a ceramic such as $Al_2O_3$, AlN or the like. Accordingly, the inside of the chamber 1 is airtightly sealed.

A disc-shaped planar antenna member 31 is provided on the microwave transmitting plate 28 to be opposite the mounting table 2. The planar antenna member may have a quadrilateral plate shape or other shape without being limited to the disc shape, and is held by an upper portion of the sidewall of the chamber 1. The planar antenna member 31 is made of a copper or aluminum plate whose surface is coated with gold or silver. Further, microwave irradiation slots 32 for radiating a microwave is formed to penetrate through the planar antenna member 31 in a specific pattern.

Figure 2:
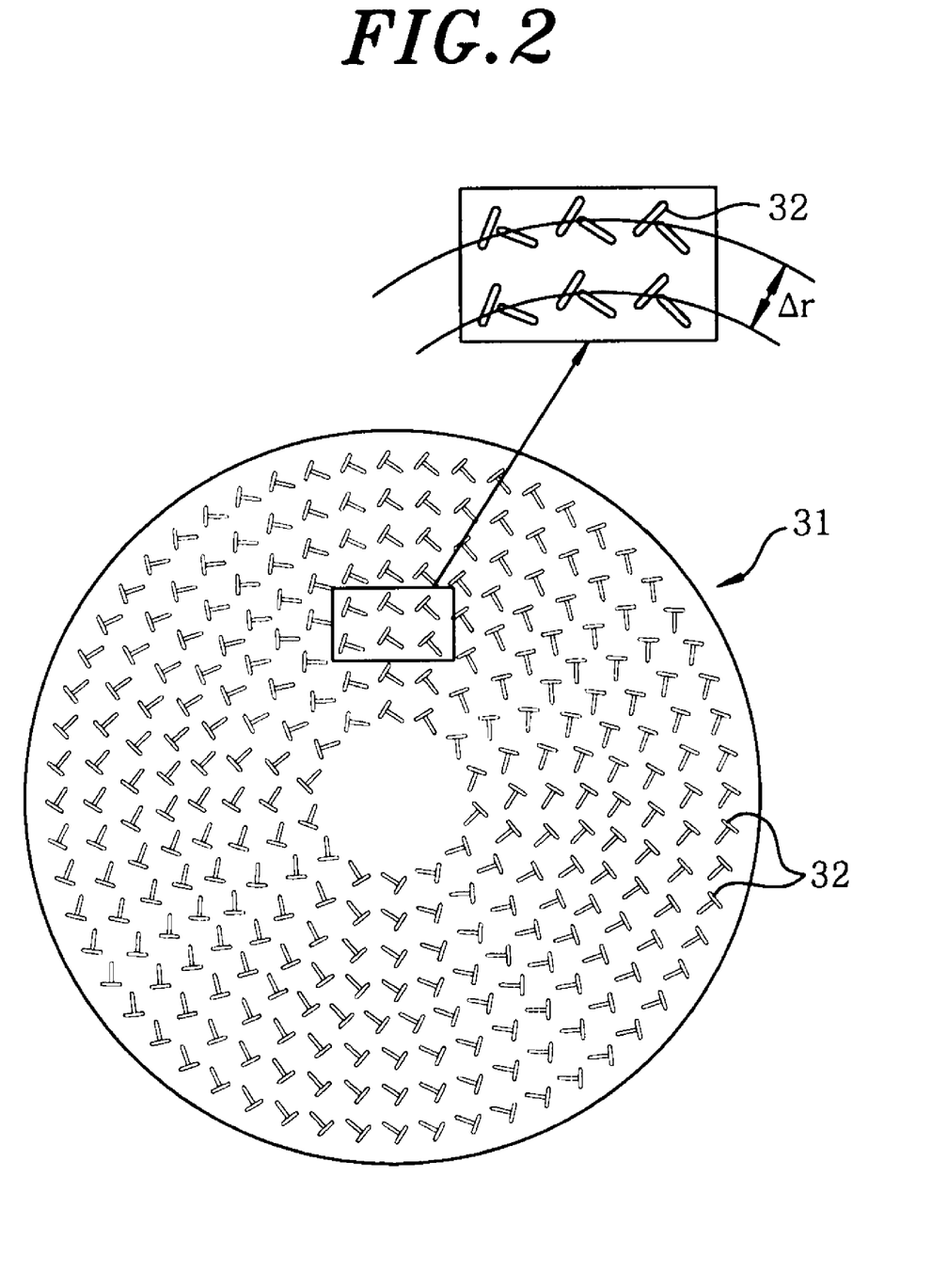
FIG. 2 shows the structure of a planar antenna member.

As shown in FIG. 2, each of the microwave irradiation slots 32 is of an elongated shape. Typically, a pair of the microwave irradiation slots 32 is arranged in a T shape, and a plurality of such pairs are arranged along concentric circular lines. A length of each of the microwave irradiation slots 32 and a distance between two adjacent microwave irradiation slots 32 are determined by a wavelength kg of a microwave. For example, the microwave irradiation slots 32 are arranged to be spaced apart from each other at an interval of $\lambda g/4$, $\lambda g/2$ or $\lambda g$. Referring to FIG. 2, a distance between two of the microwave irradiation slots 32 respectively arranged in adjacent concentric circles is indicated by $\Delta r$. Each of the microwave irradiation slots 32 may have a circular shape, an arc shape or the like. Further, the microwave irradiation slots 32 may be arranged in, for example, a spiral or a radial pattern without being limited to the concentric circular pattern.

A wave retardation member 33 having a dielectric constant higher than that of a vacuum is provided on a top surface of the planar antenna member 31. Because the wavelength of the microwave is increased in a vacuum, the wave retardation member 33 serves to shorten the wavelength of the microwave to thereby control the plasma. Although there may exist a gap between the planar antenna member 31 and the microwave transmitting plate 28 and between the wave retardation member 33 and the planar antenna member 31, it is preferable that there is no gap therebetween.

Provided on the top surface of the chamber 1 is a shield lid 34 for covering the planar antenna member 31 and the wave retardation member 33, wherein the shield lid 34 is made of a metal material, for example, aluminum, stainless steel or the like. The top surfaces of the chamber 1 and the shield lid 34 are sealed by a sealing member 35. Further, a cooling water path 34a is formed in the shield lid 34, and, by circulating cooling water therethrough, the shield lid 34, the wave retardation member 33, the planar antenna member 31 and the microwave transmitting plate 28 are cooled. Furthermore, the shield lid 34 is grounded.

An opening 36 is formed in a central portion of an upper wall of the shield lid 34, and a waveguide 37 is connected to the opening. A microwave generator 39 for generating a microwave is connected to an end portion of the waveguide 37 via a matching circuit 38. Accordingly, a microwave having a frequency of, for example, about 2.45 GHz, which is generated by the microwave generator 39, is propagated to the planar antenna member 31 via the waveguide 37. As for a frequency of the microwave, 8.35 GHz, 1.98 GHz or the like may also be employed.

The waveguide 37 includes a coaxial waveguide 37a having a circular cross section and extending upward from the opening 36 of the shield lid 34, and a horizontally extending rectangular waveguide 37b connected to an upper portion of the coaxial waveguide 37a via a mode transducer 40. The mode transducer 40 disposed between the rectangular waveguide 37b and the coaxial waveguide 37a functions to convert a microwave propagated in a TE mode through the rectangular waveguide 37b into a microwave of a TEM mode. An internal conductor 41 extends in the center of the coaxial waveguide 37a and is fixedly connected at its lower end with the center of the planar antenna member 31. Accordingly, the microwave is efficiently and uniformly propagated to the planar antenna member 31 radially through the internal conductor 41 of the coaxial waveguide 37a.

Each component in the plasma processing apparatus 100 is connected to and controlled by a process controller 50 having a CPU. The process controller 50 is connected to a user interface 51 having a keyboard where a process operator inputs commands for managing the plasma processing apparatus 100, a display for displaying the operation status of the plasma processing apparatus 100, and the like.

Also, the process controller 50 is connected to a storage unit 52 for storing therein recipes including control programs (software) for implementing various processes in the plasma processing apparatus 100 under the control of the process controller 50, processing condition data and the like.

The process controller 50 executes a recipe retrieved from the storage unit 52 in response to instructions inputted from the user interface 51 or the like when necessary, so that a required process is performed by the plasma processing apparatus 100 under the control of the process controller 50. Further, recipes such as the control program, the processing condition data and the like can be retrieved from a computer-readable storage medium, for example, a CD-ROM, a hard disc, a flexible disc, flash memory or the like, or transmitted on-line from another device via, for example, a dedicated line whenever necessary.

The plasma processing apparatus 100 configured as above can perform a plasma process without inflicting damage on an underlying film or the like at a relative low temperature not higher than about 800° C., and also can realize a uniform processing with a plasma of high uniformity.

The RLSA type plasma processing apparatus 100 configured as above can perform a process for forming a silicon oxynitride film by nitriding a silicon oxide film of a wafer W in accordance with the following procedural sequence.

First, the wafer W having the silicon oxide film is loaded from the transfer port 25 into the chamber 1 by opening the gate valve 26, and then is mounted on the mounting table 2. Next, an Ar gas and a $N_2$ gas are introduced at predetermined flow rates respectively from the Ar gas supply source 17 and the $N_2$ gas supply source 18 into the chamber 1 through the gas inlet unit 15. Specifically, the flow rate of a rare gas such as Ar is set to 2000 ml/min (sccm), and that of the $N_2$ gas is set to 150 ml/min (sccm). The inner pressure of the chamber 1 is adjusted to a processing pressure of 127 Pa, and the mounting table 2 is heated to a set temperature of 400° C.

Thereafter, the microwave generated from the microwave generation device 39 is transferred to the waveguide 37 via the matching circuit 38, and then made to sequentially pass through the rectangular waveguide 37b, the mode transducer 40 and the coaxial waveguide 37a. Next, the microwave is supplied to the planar antenna member 31 via the internal conductor 41, and then is emitted to a space above the wafer W in the chamber 1 via the transmitting plate 28 from the slots of the planar antenna member 31. The microwave is propagated in the TE mode within the rectangular waveguide 37b. Then, the microwave of the TE mode is converted into the TEM mode by the mode transducer 40, and the mode-converted microwave is propagated toward the planar antenna member 31 via the coaxial waveguide 37a. As such, the microwave is produced at about 1.2 kW.

Due to the microwave emitted from the planar antenna member 31 to the inner space of the chamber 1 via the microwave transmitting plate 28, an electromagnetic field is generated in the chamber 1 to thereby turn the Ar and the $N_2$ gas into a plasma. Specifically, the emission of the microwave via the plurality of microwave irradiation slots 32 of the planar antenna member 31 renders the microwave plasma into a high density of about $1 \times 10^{10}$ to $5 \times 10^{12}/cm^3$, and also into a low electron temperature not higher than about 1.5 eV at the vicinity of the wafer W. The microwave plasma thus generated inflicts less damage by ions or the like to the underlying film. Moreover, nitrogen is introduced into the silicon oxide film ($SiO_2$ film) by a reaction involving active species in the plasma (especially nitrogen radicals N*) or the like, thereby forming a silicon oxynitride film (i.e., SiON film).

The plasma processing apparatus 100 is preferably used for a nitriding process such that the silicon oxide film formed on the wafer W is nitrided to form the silicon oxynitride film. The silicon oxynitride film may be used as a gate insulating film of a transistor, and also finds preferable use as a gate insulating film of a 3D-structured transistor having a fin, a recess gate or a double gate structure or the like. The 3D-structured transistor is drawing attention for being used in lieu of conventional planar MOS transistors along the trend of reducing the design rule required for enhancing the degree of integration and the speed of LSI.

Figure 3A:
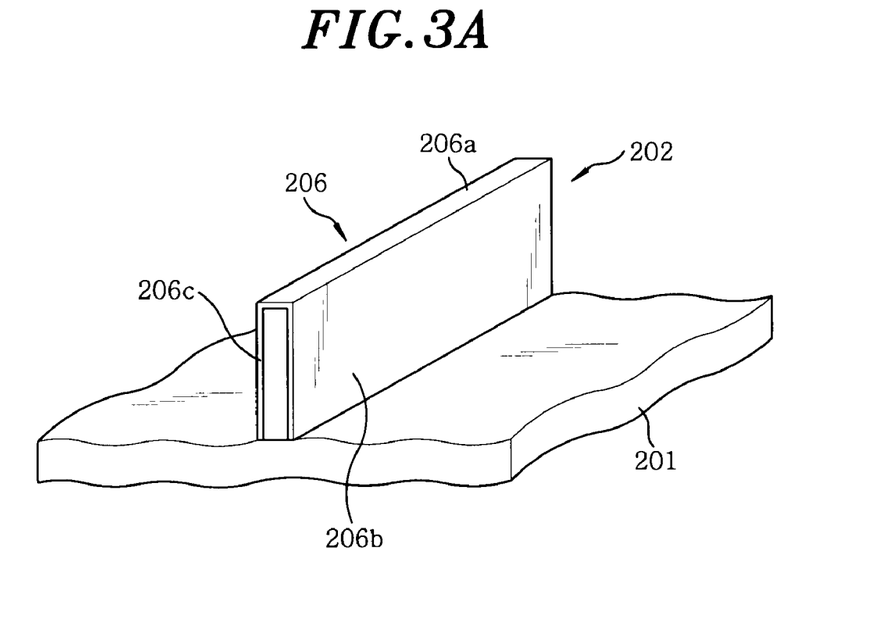
FIG. 3A is a perspective view showing a 3D-structured target having a protruding silicon wall.
Figure 3B:
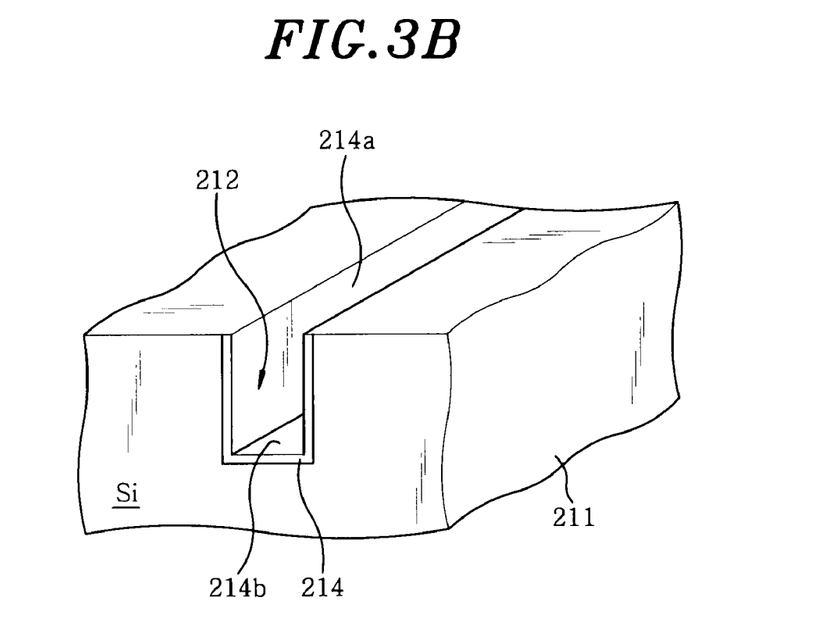
FIG. 3B is a perspective view showing a 3D-structured target having a groove-shaped depression.

FIGS. 3A and 3B show gate insulating films having a 3D structure used for a 3D-structured device.

In order to fabricate the 3D-structured device shown in FIG. 3A, a silicon wall 202 is formed to protrude from an underlying film 201 such as a $SiO_2$ film, and the surface thereof is subjected to a thermal treatment in an oxidizing atmosphere or to a plasma process using an $O_2$ gas plasma, so that the surface is oxidized to form a silicon oxide film. Then, the silicon oxide film is nitrided, thereby forming a silicon oxynitride film as a gate insulating film 206. In the device including the gate insulating film 206 of a projected three-dimensional structure, it is required to introduce nitrogen into the silicon oxynitride film in a manner that the top portion 206a and sidewall portions 206b and 206c in the gate insulating film 206 receive the nitrogen evenly. To this end, it is necessary to measure the nitrogen concentration in each portion of the silicon oxynitride film.

Further, referring to FIG. 3B, a depression 212 of a groove (or hole) shape is formed in a Si substrate 211 by etching, and the surface thereof is subjected to a thermal treatment in an oxidizing atmosphere or to plasma process using an $O_2$ gas plasma, so that the surface is oxidized to form a silicon oxide film. Then, the silicon oxide film is nitrided to form a silicon oxynitride film as a gate insulating film 214. In the device including the gate insulating film 214 of a three-dimensional groove structure, for evaluating the properties thereof, it is required to introduce nitrogen into the silicon oxynitride film such that a sidewall portion 214a and a bottom portion 214b of the gate insulating film 214 receive the nitrogen evenly. To this end, it is necessary to measure the nitrogen concentration in the silicon oxynitride film at each portion.

Figure 4A:
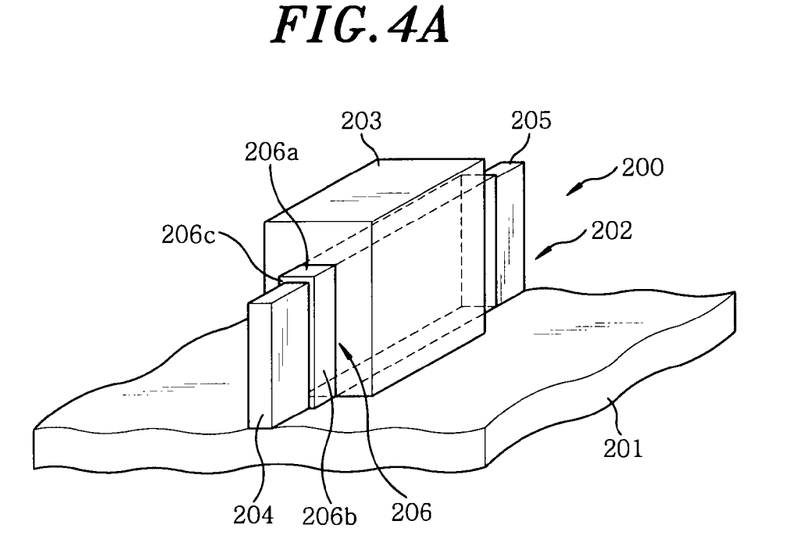
FIG. 4A is a schematic perspective view showing a MOSFET having a fin structure as an example of a 3D-structured device.

FIG. 4A schematically illustrates a MOSFET (Metal Oxide Semiconductor Field Effect Transistor) having a fin structure as an example of the 3D-structured device. The MOSFET 200 of the fin structure is provided with a silicon wall 202 having a shape of a fin or a protrusion disposed on an underlying film 201 such as a $SiO_2$ film. This transistor has a 3D structure in which a gate electrode 203 is formed on the silicon wall 202 via a gate insulating film 206 formed to cover a part of the silicon wall 202. The gate insulating film 206 is formed on the surface of the silicon wall 202 to form a 3-gate transistor in which the gate electrode 203 covers three surfaces of a top portion 206a and two sidewall portions 206b and 206c.

The portions of the silicon wall 202 located at two sides of the gate electrode 203 form a source 204 and a drain 205. The transistor is operated by flow of current between the source and the drain. Thus, the MOSFET having a 3-gate structure is advantageous in that the channel region thereof is controlled by three gates so that short channel effect can be prevented more effectively than in a conventional planar type MOSFET where a channel region is controlled by only one gate. Further, the 3-gate structured MOSFET has an advantage also in that it can cope with the current trends of further miniaturization and higher integration beyond a 32-nanometer node.

The MOSFET 200 of the above structure can be manufactured as follows. For example, a silicon film is formed by CVD on an underlying film 201 such as a $SiO_2$ film, and then an etching is conducted using a pattern mask by photolithography to form a silicon wall 202. Next, the surface of the silicon wall 202 is subjected to a thermal treatment in an oxidizing atmosphere or to plasma process using an $O_2$ gas plasma, so that the surface is oxidized to form a silicon oxide film. Thereafter, the silicon oxide film is nitrided by the plasma processing apparatus 100 of FIG. 1, thereby forming a silicon oxynitride film as a gate insulating film 206. Then, a polysilicon film is formed by CVD to cover the silicon wall 202, after which an etching is conducted using a pattern mask by photolithography, thus forming a gate electrode 203. Thus, the MOSFET 200 is obtained.

Figure 4B:
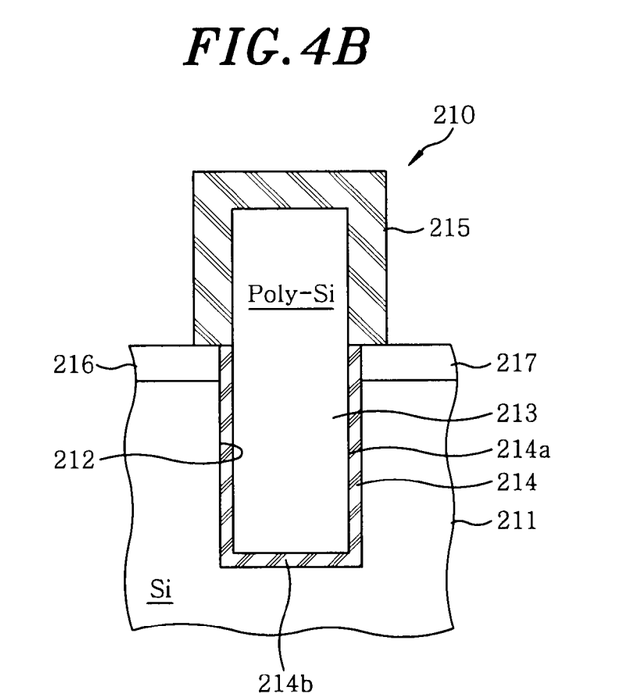
FIG. 4B is a schematic cross-sectional view showing a transistor having a recess gate structure as another example of the 3D-structured device.

Further, FIG. 4B schematically illustrates a transistor having a recess gate structure as another example of the 3D-structured device. The transistor 210 of the recess type gate is formed in a manner that a lower portion of a gate electrode 213 made of, e.g., polysilicon is buried in a groove-shaped depression 212 formed in a Si substrate 211 with a gate insulating film 214 interposed therebetween.

A source 216 and a drain 217 are formed at both sides of the depression 212, and electric current flows between the source and the drain to operate the transistor. The top portion of the gate electrode 213 is subjected to a surface nitriding process (not shown), and then covered with an insulating film 215 made of $SiO_2$ by CVD. In the transistor 210 having the recess type gate, electric current flows along the groove (depression 212), so that an effective length of the current path is extended while reducing the planar size of the gate electrode. Therefore, short channel properties are improved, and the transistor can be adapted to further miniaturization and higher integration of the semiconductor device.

The transistor 210 of the above structure can be manufactured as follows. For example, an etching is conducted using a pattern mask by photolithography to form a groove-shaped depression 212 in a Si substrate 211. Next, the inner surface of the depression 212 is subjected to a thermal treatment in an oxidizing atmosphere or to a plasma process using an $O_2$ gas plasma, so that the surface is oxidized to form a silicon oxide film. Then, the silicon oxide film is nitrided by the plasma processing apparatus 100 of FIG. 1, thereby forming a silicon oxynitride film as a gate insulating film 214.

Thereafter, the depression 212 is filled with polysilicon by CVD, after which an etching is conducted using a pattern mask by photolithography to thereby form a gate electrode 213 in a state that the lower portion thereof is buried in the depression 212 with the gate insulating film 214 interposed therebetween. Next, by performing an ion implantation using arsenic or the like, a source 216 and a drain 217 are formed in a layered form on the silicon substrate 211. The upper portion of the gate electrode 213 is subjected to a surface nitriding process, and then covered with an insulating film 215 such as $SiO_2$ by CVD, thereby completing the transistor 210.

If the nitrogen concentration in the gate insulating film 206 of the MOSFET 200 of FIG. 4A or in the gate insulating film 214 of the recess type transistor 210 of FIG. 4B is estimated by a conventional method such as XPS or SIMS, concentration data of the planar portion (i.e., the top portion 206a of the gate insulating film 206 or the bottom portion 214b of the gate insulating film 214) is mixed with the measured result of the nitrogen concentration in the sidewall portions 206b, 206c or the sidewall portion 214a. This makes it difficult to measure the nitrogen concentration distinctly and accurately.

In view of the above, the present invention provides a method of measuring the nitrogen concentration in the silicon oxynitride film including: reoxidizing a wafer W having a silicon oxynitride film, then calculating a reoxidation rate reduction ratio (RORR) based on a change in film amount, and then finding the nitrogen concentration in the silicon oxynitride film of a 3D structure formed on the surface of the wafer W by referring to a previously prepared calibration curve that depicts nitrogen concentration in a silicon nitride film as a function of reoxidation rate reduction ratio (RORR). Thus, in the sidewall portion and the planar portion of the silicon oxynitride having a 3D structure formed of a protrusion or a depression, the nitrogen concentration of each portion can be accurately determined.

Figure 5:
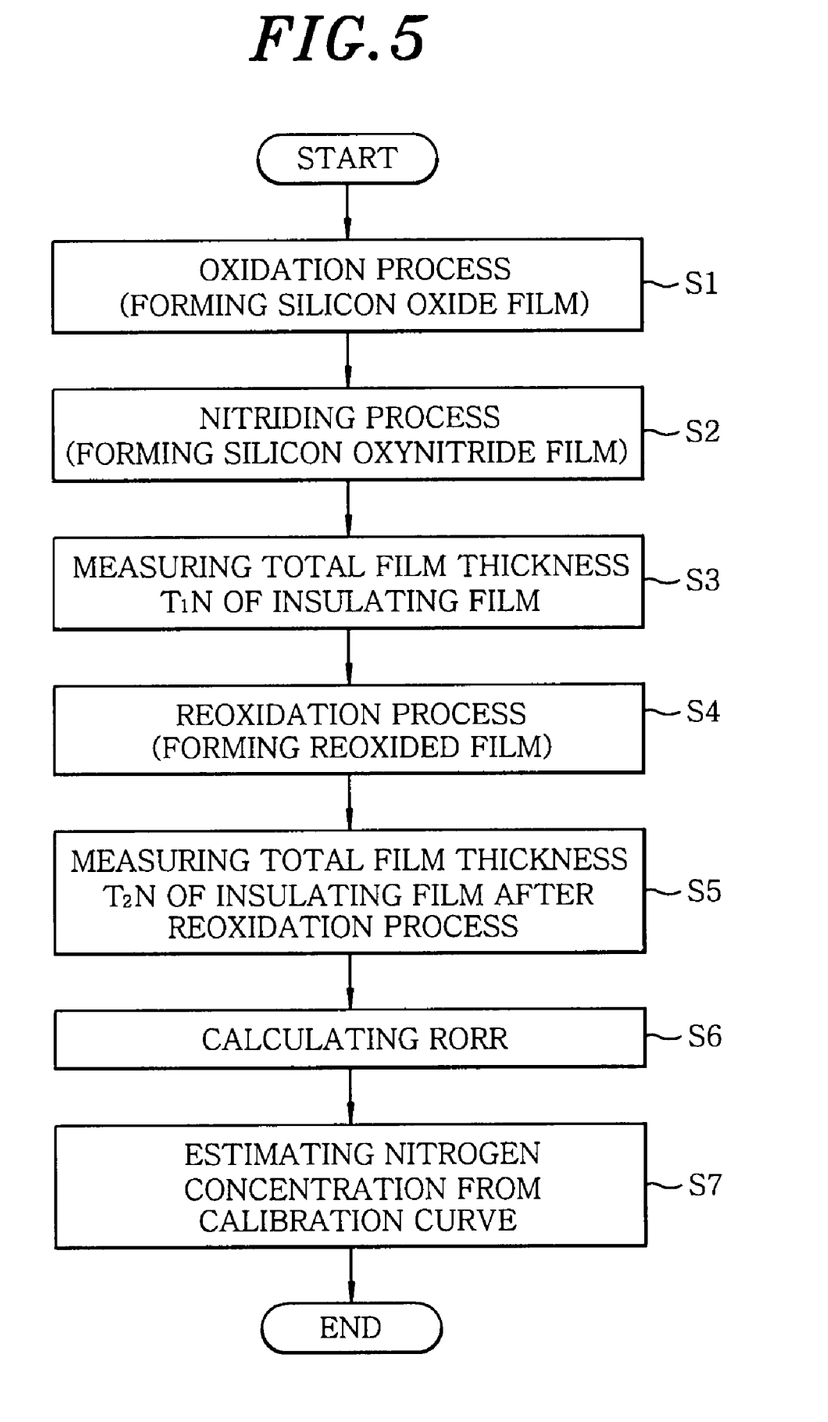
FIG. 5 is a flow chart sequentially showing the processes of measuring a nitrogen concentration according to an embodiment of the present invention.
Figure 6A:
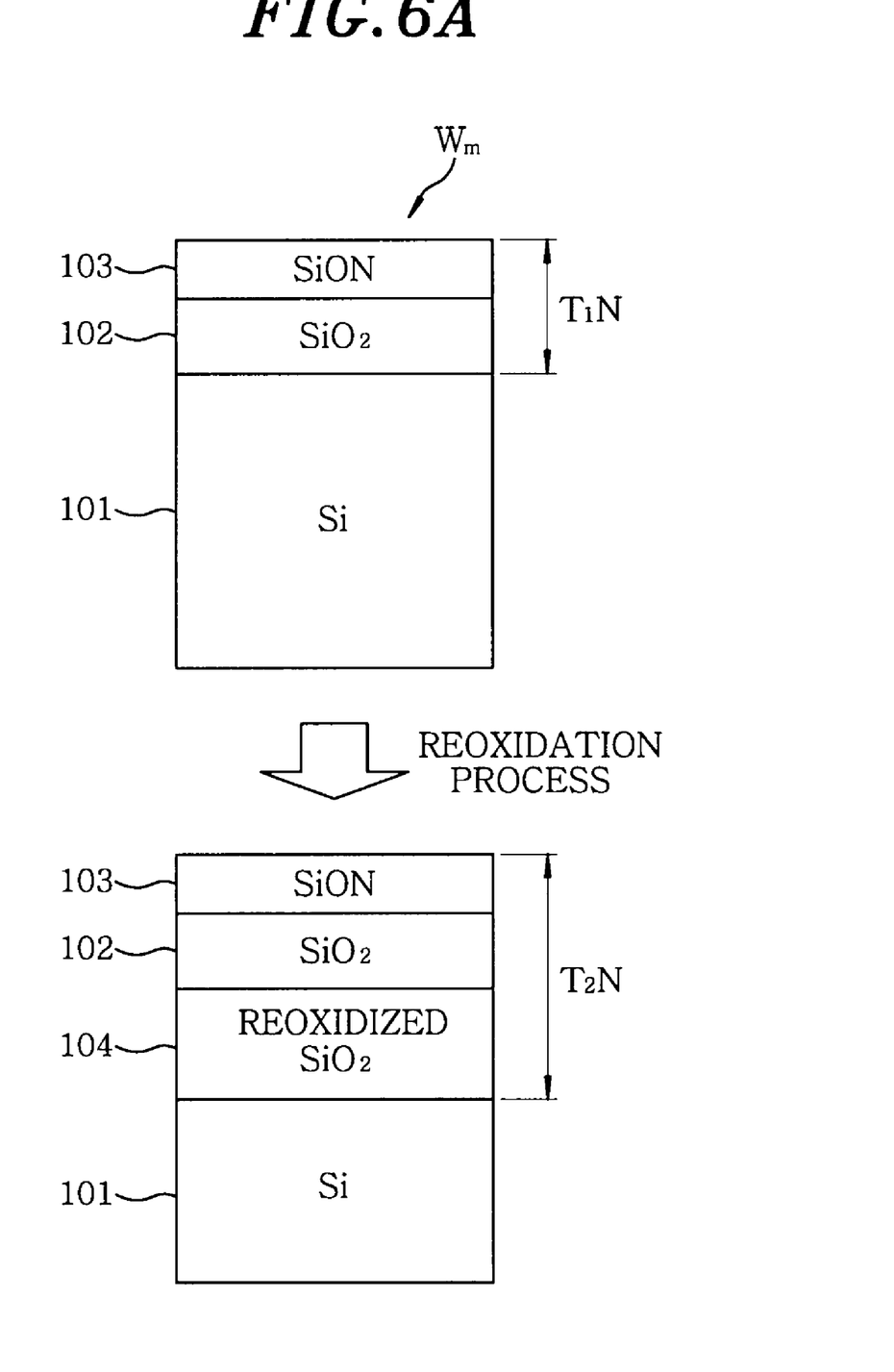
FIG. 6A shows states of an insulating film on a target wafer before and after reoxidation process.
Figure 6B:
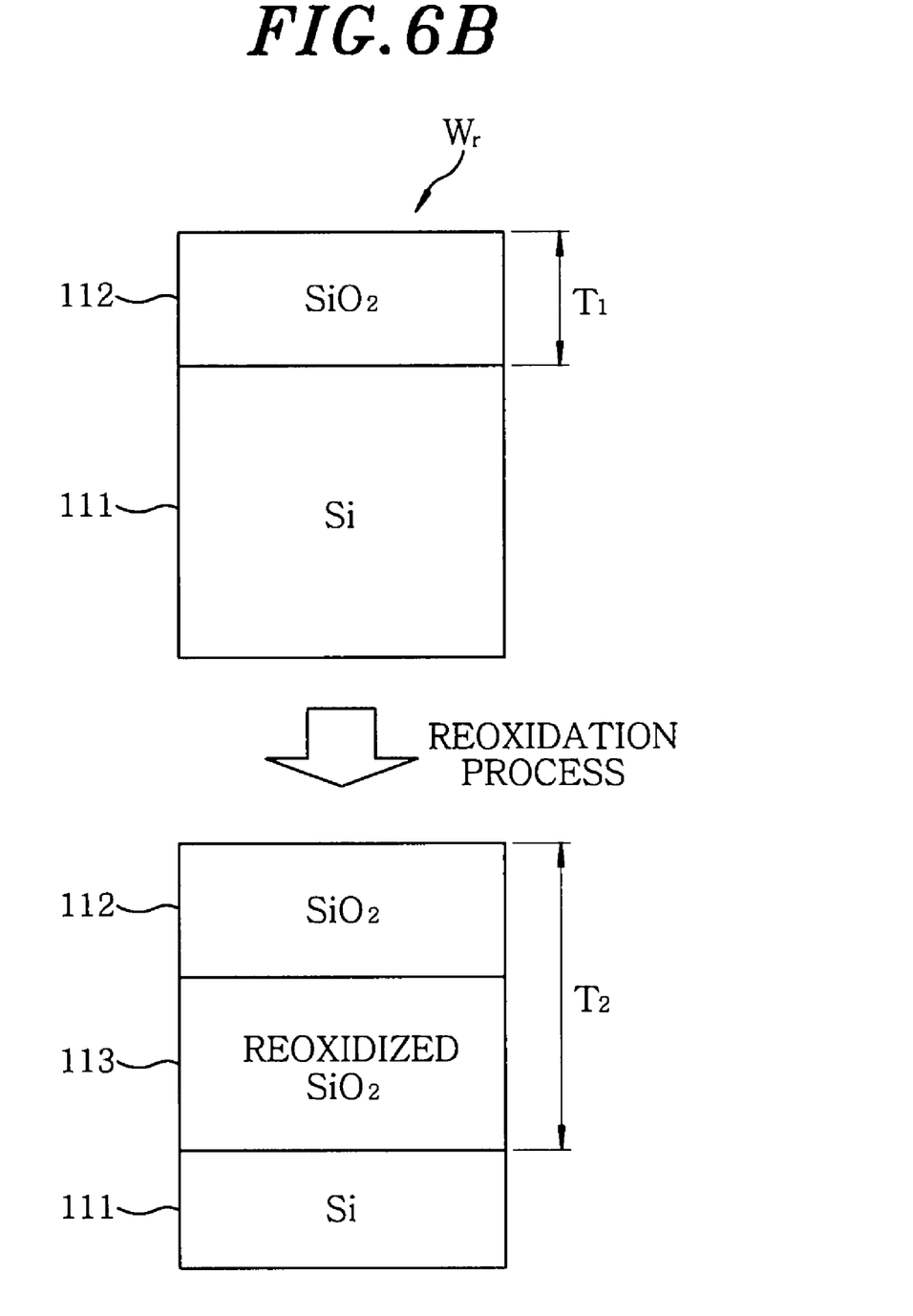
FIG. 6B shows states of an insulating film on a reference wafer before and after reoxidation process.
Figure 7:
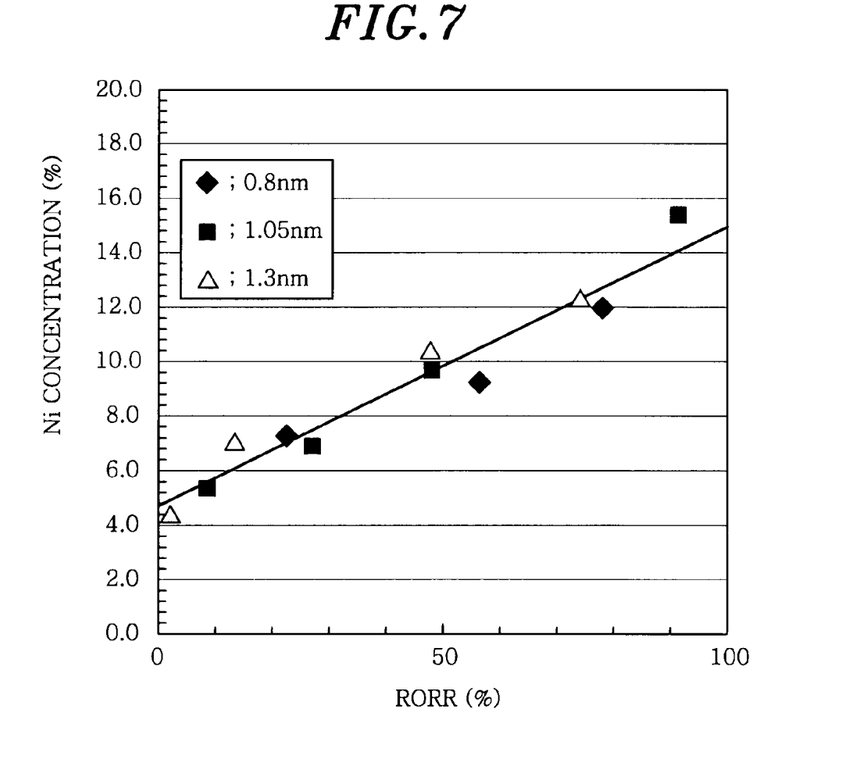
FIG. 7 shows a calibration curve used for measuring the nitrogen concentration.

Next, with reference to FIGS. 5 to 7, the method of measuring the nitrogen concentration according to the present invention will be described in detail. FIG. 5 is a flow chart showing the process of measuring a nitrogen concentration according to an embodiment of the present invention. FIG. 6A shows states of an insulating film of a target wafer before and after a reoxidation process, and FIG. 6B shows states of an insulating film of a reference wafer before and after a reoxidation process for calculating the reoxidation rate reduction ratio used for the measurement of the nitrogen concentration. FIG. 7 shows a calibration curve used for measuring the nitrogen concentration.

First, a calibration curve is prepared in advance as exemplified in FIG. 7, in which the calibration curve is plotted on the basis of data obtained when silicon oxynitride films (SiON films) are formed by nitriding silicon oxide films ($SiO_2$ films) whose thicknesses are 0.8 nm, 1.05 nm and 1.3 nm, respectively, under the following nitriding process conditions. The nitriding process is performed by the plasma processing apparatus 100 of FIG. 1 under the conditions that flow rates of Ar and $N_2$ are 2000 and 150 ml/min (sccm), respectively; an inner pressure of the chamber 1 is 127 Pa; a heating temperature of the mounting table 2 is 400° C.; an electric power of the microwave is 1.2 kW; and time lengths of nitriding process are 4, 7, 10 and 30 sec, respectively.

The calibration curve is plotted by sequentially performing steps S1 to S6 (which will be described later) with respect to a measurement target wafer Wm and a reference wafer Wr that have planar silicon surfaces to determine the reoxidation rate reduction ratio (RORR) using Equation 1 shown below, and also by actually measuring the nitrogen concentration in the silicon oxynitride film (SiON film) using XPS analysis on the wafer Wm having a silicon oxynitride film (SiON film). The correlation coefficient between thus obtained reoxidation rate reduction ratio (RORR) in the silicon oxynitride film (SiON film) and the actually measured nitrogen concentration is about 0.93 (in case of FIG. 7), which is appraised to be high.

Further, there is no need for using the 3D-structured device when plotting the calibration curve, because it is possible to use the nitrogen concentration data obtained for a silicon oxide film ($SiO_2$ film) of a planar shape being nitrided to be formed into a silicon oxynitride film. Therefore, the calibration curve can be easily prepared.

As shown in FIG. 5, when measuring the nitrogen concentration, firstly the surface of a measurement target wafer Wm is subjected to a thermal treatment in an oxidizing atmosphere to thereby form a silicon oxide film (in step S1). The thickness of the silicon oxide film is defined as a first film thickness. Although the first film thickness may be set to about 1.05 nm, it is preferable to set the first film thickness to be 0.5 to 15 nm (more preferably, 0.8 to 13 nm) in consideration of the measurement accuracy.

The silicon oxide film may be formed in various ways. For example, the plasma oxidation process may be conducted by a plasma processing apparatus configured same as in the plasma processing apparatus 100 of FIG. 1, wherein an $O_2$ gas source is used in lieu of the $N_2$ gas source 18, and a processing gas containing $O_2$ is supplied into the chamber 1 in which the wafer Wm is disposed. Alternatively, a single-wafer or batch type thermal oxidation process may be conducted by a low pressure annealing (LPA) apparatus or a high speed annealing apparatus to form the silicon oxide film.

Next, in step S2, the silicon oxide film ($SiO_2$ film) 102 obtained in step S1 is nitride to form the silicon oxynitride film (SiON film) 103 as shown in FIG. 6A. The nitriding process may preferably be performed by the plasma processing apparatus 100 of FIG. 1, but may also be conducted by other methods, for example, an inductive coupling plasma (ICP) process, a surface wave plasma process, an electron cyclotron resonance (ECR) plasma process, a magnetron process, a remote plasma process and the like.

Conditions for the nitriding process performed by the plasma processing apparatus of FIG. 1 are not particularly limited, but may preferably be set such that a flow rate of a rare gas (such as an Ar gas) is about 100 to 5000 ml/min (sccm), and that of a $N_2$ gas is about 5 to 500 ml/min (sccm). Further, it is preferable that an internal pressure of the chamber 1 is set to be within a range from 1 to 1333 Pa, and a heating temperature of the mounting table 2 is set to be within a range from a room temperature to 800° C. It is preferable to set a microwave power generated by the microwave generator 39 to be 1 to 5 kW.

Next, in step S3, a total film thickness $T_1N$ of the silicon oxynitride film (SiON film) 103 and the silicon oxide film ($SiO_2$ film) 102 remaining under the silicon oxynitride film 103 of the wafer Wm after completing the plasma nitriding process is measured. The total film thickness $T_1N$ may be measured by various kinds of method including, for example, cutting the wafer Wm to measure the thickness of each film shown in the longitudinal cross section using a transmission electron microscope (TEM). The method for measuring the film thickness is not particularly limited, and it is also possible to use, for example, an optical film thickness measure using a laser beam.

Thereafter, in step S4, the wafer Wm is reoxidized in an oxidizing atmosphere. This reoxidation process is conducted by subjecting the wafer Wm to a thermal oxidation process. In the thermal oxidation process, the oxide film grows in an isotropic manner. Thus, for example, in the 3D-structured silicon oxynitride film 103 having a side portion and a planar portion, reoxidation can be conducted substantially evenly for the side portion and the planar portion. The thermal treatment may be performed by, for example, a low pressure annealing (LPA) apparatus of a conventional configuration.

The thermal treatment conditions are not particularly limited. In case of using, for example, a low pressure annealing (LPA) device, the thermal treatment conditions include: a flow rate of $O_2$ (which is a processing gas) of 2 l/min (slm), a processing pressure of 79980 Pa (600 Torr), a processing temperature of 1100° C., and a processing time of 70 sec. In this manner, oxygen is diffused into the silicon substrate 101 and the silicon oxide film ($SiO_2$ film) 102 in the wafer Wm due to the reoxidation, so that a silicon oxide film (reoxidized $SiO_2$ film) 104 is formed. The thickness of the silicon oxide film 104 is defined as a second film thickness.

Then, in step S5, a total film thickness $T_2N$ of the wafer Wm after completing the reoxidation process is measured by using a TEM. In the reoxidation process of the previous step S4, it is preferred that the total film thickness $T_2N$ of the silicon oxynitride film (SiON film) 103, the silicon oxide film ($SiO_2$ film) 102 and the silicon oxide film (reoxidized $SiO_2$ film) 104 be controlled to fall within a desired film thickness range. Specifically, to secure the accuracy of the concentration measurement, conditions for reoxidation process are preferably set such that the total film thickness $T_2N$ after completing the reoxidation process is 5 to 25 nm (more preferably, 10 to 20 nm). Further, it is preferred that the initial thicknesses of the silicon oxide film (SiO$_2$ film) 102 and the silicon oxynitride film (SiON film) 103 be set such that the total film thickness T$_2$N after completing the reoxidation process also falls within the above thickness range.

As shown in FIG. 6B, an oxidation process is conducted under conditions same as those of step S1 to prepare a reference wafer Wr having a silicon oxide film (SiO$_2$ film) 112 whose thickness is 1.05 nm formed on the surface of a silicon substrate 111. Like the wafer Wm, the silicon substrate 111 of the reference wafer Wr has a 3D structure such as a protrusion or a depression. The reference wafer Wr is oxidized under conditions same as those of step S1, and then reoxidized under conditions same as those of step S4 performed on the wafer Wm. However, the nitriding process of step S2 is not performed on the reference wafer Wr.

As shown in FIG. 6B, the reference wafer Wr is subjected to a reoxidation process to form a silicon oxide film (reoxidized SiO$_2$ film) 113 between the silicon substrate 111 and the silicon oxide film (SiO$_2$ film) 112. Subsequent to the reoxidation process, the reference wafer Wr is observed by a TEM, thus measuring a total film thickness T$_2$ of the silicon oxide film 112 and the reoxidized SiO$_2$ film 113.

Then, in step S6, the reoxidation rate reduction ratio (RORR) of the target substrate is calculated from the total film thicknesses T$_1$N, T$_2$N, and T$_2$ obtained in steps S1 to S5 by using Equation 1 below.

$$RORR(\%) = \{(T_2 - T_2N)/(T_2 - T_1N)\} \times 100 \quad \text{(Equation 1)}$$

Next, in step S7, the RORR thus obtained is compared with the calibration curve previously prepared as above, thereby determining the nitrogen concentration in the silicon oxynitride film (SiON film) 103 on the wafer Wm. In this manner, the present embodiment of the invention makes use of the fact that, in the wafer Wm having the silicon oxynitride film (SiON film) 103, the ratio of oxygen permeating the silicon oxynitride film 103 during the reoxidation process varies depending on the nitrogen concentration in the film, and thus an increase in the film amount caused by the reoxidation process varies accordingly. By comparing the increase in the film amount in the target wafer Wm with that in the reference wafer Wr that has no silicon oxynitride film, the nitrogen concentration in the silicon oxynitride film 103 is measured.

In the method of measuring the nitrogen concentration through the above process sequences according to the present embodiment, it is possible to determine with a high accuracy the nitrogen concentration in the silicon oxynitride film (SiON film) obtained by nitriding the silicon oxide film (SiO$_2$ film) having a three-dimensional structure as in a 3D-structured device. Specifically, the nitrogen concentration in the silicon oxynitride film (SiON film) can be measured separately in the MOSFET 200 of a fin structure shown in FIG. 4A, and in each of the sidewall portion 214a and the bottom portion 214b in the gate insulating film 214 formed in the depression 212 of the transistor 210 of a recess gate structure shown in FIG. 4B.

Further, in case of, e.g., forming a silicon oxynitride film (SiON film) as the gate insulating film in a 3D-structured device, the results of measurement of nitrogen concentration are fed back to nitriding process conditions. By this feedback, the nitriding process conditions can be optimized such that the nitrogen concentration in the resulting silicon oxynitride film can be adjusted to a desired level according to the purpose and the portion (e.g., whether a planar portion or a sidewall portion).

Figure 8:
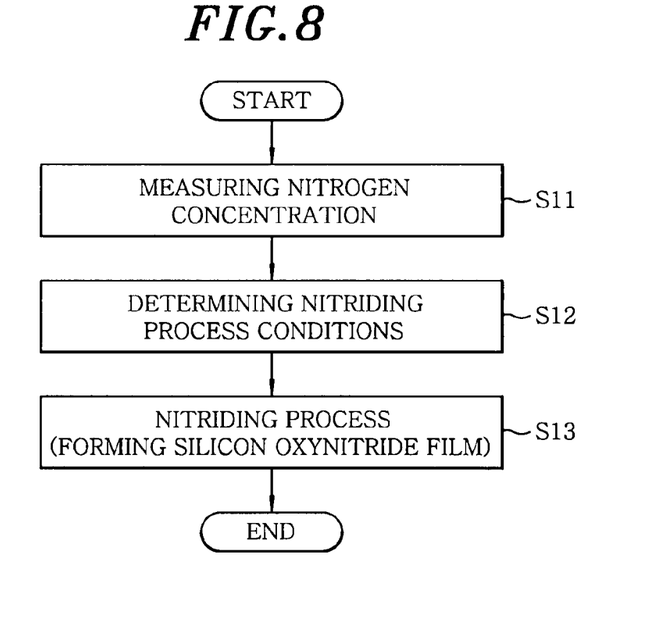
FIG. 8 is a flow chart sequentially depicting the nitriding process according to the present invention.

FIG. 8 is a flow chart sequentially showing the nitriding process using the process of measuring the nitrogen concentration. First, in step S11, the nitrogen concentration in the previously formed silicon oxynitride film is measured through steps S3 to S7. Here, a wafer W used as a measurement target regarding the nitrogen concentration may be, for example, selected from a lot whose wafers have been nitrided. Further, although the nitriding process is not particularly limited, it is preferable to use the plasma processing apparatus 100 of FIG. 1.

Thereafter, in step S12, based on the results of the nitrogen concentration measurement in step S11, nitriding process conditions are reexamined to achieve desirable film properties (such as dielectric constant) according to the purpose of the nitriding process, the usage of the silicon oxynitride film and the kind of device to be manufactured. Thus, the optimal nitriding process conditions are determined. The nitriding process conditions include, for example, the microwave frequency in the plasma processing apparatus 100, the kind of gas supplied into the chamber 1, the gas flow rate and gas flow rate ratio, the processing pressure, the processing temperature, the gap between the microwave transmitting plate 28 and the wafer W, the electric power and the processing time.

Next, in step S13, the wafer W having the silicon oxide film formed in advance is nitrided under the nitriding conditions determined in step S12, thus forming the silicon oxynitride film. In this case, the nitriding process is not particularly limited, but it is proper that the same process as in the nitriding process on the wafer W in step S11 be used. Further, it is preferable to use the plasma processing apparatus 100 of FIG. 1.

Through steps S11 to S13, the silicon oxide film is nitrided under the optimal nitriding process conditions, thus making it possible to form a high-quality silicon oxynitride film having a desired nitrogen concentration. Further, by incorporating the above-described process of forming the silicon oxynitride film into the fabrication of the semiconductor device, desirable properties can be obtained for not only a planar type transistor but also a 3D-structured device such as a 3D-structured transistor.

The method of measuring the nitrogen concentration in the silicon oxynitride film described as above may also be applied to a nitride film formed from metal oxide having a high dielectric constant such as Al$_2$O$_3$, HfO$_2$, LaO$_2$, ZrO$_2$, silicate such as HfSiO or ZrSiO, or aluminate such as AlHfO$_3$. Also, the technical scope of the present invention is applicable to the concentration measurement for not only nitrogen but also various other dopants.

Although in the above the embodiment of the present invention have been disclosed the inventions is not limited thereto, and various modifications can be made.

For instance, the method of the present invention is not limited to manufacturing a gate insulating film of a transistor, but may also be applied to fabricating various other semiconductor devices including a silicon oxynitride film obtained by nitriding a silicon oxide film for the purpose of reducing a film thickness or increasing a dielectric constant.

What is claimed is:

1. A method of measuring a nitrogen concentration in a silicon oxynitride film obtained by nitriding a silicon oxide film formed on a surface of a measurement target substrate, comprising:

measuring a total film thickness T$_1$N of the silicon oxynitride film and the silicon oxide film remaining thereunder;

reoxidizing the measurement target substrate;

measuring a total film thickness T$_2$N of the silicon oxynitride film, the silicon oxide film and a reoxidized silicon oxide film formed on the measurement target substrate after reoxidizing the measurement target substrate;

reoxidizing a reference substrate having a silicon oxide film formed thereon independently of the measurement target substrate;

measuring a total film thickness $T_2$ of the silicon oxide film and a reoxidized silicon oxide film formed on the reference substrate after reoxidizing the reference substrate;

calculating a reoxidation rate reduction ratio of the measurement target substrate from the total film thicknesses $T_1N$, $T_2N$ and $T_2$ by using Equation 1; and determining the nitrogen concentration in the silicon oxynitride film on the measurement target substrate based on the calculated reoxidation rate reduction ratio, wherein Equation 1 is as follows:

$$RORR(\%)=\{(T_2-T_2N)/(T_2-T_1N)\}\times 100.$$

2. The method of claim 1, wherein the silicon oxynitride film is formed on a surface of a silicon layer in a three-dimensional structure with the silicon oxide film being disposed therebetween.

3. The method of claim 2, wherein the silicon layer has a projection and/or a depression.

4. The method of claim 1, wherein the reoxidizing is conducted by thermal oxidation.

5. The method of claim 1, wherein, in determining the nitrogen concentration in the silicon oxynitride film, a calibration curve is previously prepared based on a nitrogen concentration in a silicon oxynitride film having a planar structure and the reoxidation rate reduction ratio, and the reoxidation rate reduction obtained by Equation 1 is compared with the calibration curve.

6. The method of claim 1, wherein the silicon oxynitride film on the measurement target substrate is an insulating film in a three-dimensionally structured device.

7. A method of forming a silicon oxynitride film by nitriding a silicon oxide film formed on a surface of a processing target substrate, comprising:

nitriding a silicon oxide film formed on a surface of a measurement target substrate to form a silicon oxynitride film;

measuring a total film thickness $T_1N$ of the silicon oxynitride film measurement target substrate and the silicon oxide film remaining thereunder;

reoxidizing the measurement target substrate;

measuring a total film thickness $T_2N$ of the silicon oxynitride film, the silicon oxide film and a reoxidized silicon oxide film formed on the measurement target substrate after reoxidizing the measurement target substrate;

reoxidizing a reference substrate having a silicon oxide film formed thereon independently of the measurement target substrate;

measuring a total film thickness $T_2$ of the silicon oxide film and a reoxidized silicon oxide film formed on the reference substrate after reoxidizing the reference substrate;

calculating a reoxidation rate reduction ratio of the measurement target substrate from the total film thicknesses $T_1N$, $T_2N$ and $T_2$ by using Equation 1;

determining the nitrogen concentration in the silicon oxynitride film on the measurement target substrate based on the calculated reoxidation rate reduction ratio;

determining nitriding process conditions for the silicon oxide film on the processing target substrate based on the determined nitrogen concentration; and nitriding the silicon oxide formed on the surface of the processing target substrate under the determined nitriding process conditions to form the silicon oxynitride film;

wherein Equation 1 is as follows:

$$RORR(\%)=\{(T_2-T_2N)/(T_2-T_1N)\}\times 100.$$

8. The method of claim 7, wherein the silicon oxynitride film is formed on a surface of a silicon layer in a three-dimensional structure with the silicon oxide film being disposed therebetween.

9. The method of claim 8, wherein the silicon layer has a projection and/or a depression.

10. The method of claim 7, wherein the reoxidizing is conducted by thermal oxidation.

11. The method of claim 7, wherein, in determining the nitrogen concentration in the silicon oxynitride film, a calibration curve is previously prepared based on a nitrogen concentration in a silicon oxynitride film having a planar structure and the reoxidation rate reduction ratio, and the reoxidation rate reduction obtained by Equation 1 is compared with the calibration curve.

12. The method of claim 7, wherein the silicon oxynitride film on the measurement target substrate is an insulating film in a three-dimensionally structured device.

13. The method of claim 7, wherein the nitriding is conducted by a plasma processing apparatus that generates a plasma by introducing a microwave into a processing chamber using a planar antenna having slots.

14. A method of manufacturing a semiconductor device including forming a silicon oxynitride film by nitriding a silicon oxide film formed on a surface of a processing target substrate, wherein said forming the silicon oxynitride film comprises:

nitriding a silicon oxide film formed on a surface of a measurement target substrate to form a silicon oxynitride film;

measuring a total film thickness $T_1N$ of the silicon oxynitride film measurement target substrate and the silicon oxide film remaining thereunder;

reoxidizing the measurement target substrate;

measuring a total film thickness $T_2N$ of the silicon oxynitride film, the silicon oxide film and a reoxidized silicon oxide film formed on the measurement target substrate after reoxidizing the measurement target substrate;

reoxidizing a reference substrate having a silicon oxide film formed thereon independently of the measurement target substrate;

measuring a total film thickness $T_2$ of the silicon oxide film and a reoxidized silicon oxide film formed on the reference substrate after reoxidizing the reference substrate;

calculating a reoxidation rate reduction ratio of the measurement target substrate from the total film thicknesses $T_1N$, $T_2N$ and $T_2$ by using Equation 1;

determining the nitrogen concentration in the silicon oxynitride film on the measurement target substrate based on the calculated reoxidation rate reduction ratio;

determining nitriding process conditions for the silicon oxide film on the processing target substrate based on the determined nitrogen concentration; and nitriding the silicon oxide formed on the surface of the processing target substrate under the determined nitriding process conditions to form the silicon oxynitride film, wherein Equation 1 is as follows:

$$RORR(\%)=\{(T_2-T_2N)/(T_2-T_1N)\}\times 100.$$

15. The method of claim 14, wherein the silicon oxynitride film is formed on a surface of a silicon layer in a three-dimensional structure with the silicon oxide film being disposed therebetween.

16. The method of claim 15, wherein the silicon layer has a projection and/or a depression.

17. The method of claim 14, wherein the reoxidizing is conducted by thermal oxidation.

18. The method of claim 14, wherein, in determining the nitrogen concentration in the silicon oxynitride film, a calibration curve is previously prepared based on a nitrogen concentration in a silicon oxynitride film having a planar structure and the reoxidation rate reduction ratio, and the reoxidation rate reduction obtained by Equation 1 is compared with the calibration curve.

19. The method of claim 14, wherein the silicon oxynitride film on the measurement target substrate is an insulating film in a three-dimensionally structured device.

20. The method of claim 14, wherein the semiconductor device is a three-dimensionally structured transistor.

* * * * *